United States Patent [19]

Harrand

[11] Patent Number: 5,349,547
[45] Date of Patent: Sep. 20, 1994

[54] BIDIMENSIONAL FIR FILTER

[75] Inventor: Michel Harrand, Seyssinet-Pariset, France

[73] Assignee: SGS-Thomson Microelectronics S.A., Saint-Genis Pouilly, France

[21] Appl. No.: 111,624

[22] Filed: Aug. 25, 1993

Related U.S. Application Data

[63] Continuation of Ser. No. 926,815, Aug. 7, 1992, Pat. No. 5,265,041.

[30] Foreign Application Priority Data

Aug. 9, 1991 [FR] France ............... 91 10425

[51] Int. Cl.$^5$ .............................. G06F 15/31
[52] U.S. Cl. .................... 364/724.05; 364/724.16
[58] Field of Search ............ 364/724.05, 724.16

[56] References Cited

U.S. PATENT DOCUMENTS

| 4,328,426 | 5/1982 | D'Ortenzio | 364/724.05 X |
| 4,821,223 | 4/1989 | David | 364/724.05 |
| 4,941,191 | 7/1990 | Miller et al. | 364/724.05 X |

OTHER PUBLICATIONS

Suresh et al "Exact Realisation of 2-Dimensional Digital Filters by Separable Filters", Electronics Letters 13th May 1976 vol. 12, No. 12, pp. 242–244.

IEEE Transactions on Circuits and Systems, vol. 26, No. 6, Jun. 1989, New York, US, pp. 813–820, Parhi et al., "Concurrent Architectures for Two-Dimensional Recursive Digital Filtering".

Patent Abstracts of Japan, vol. 10, No. 236 (E-435) Sep. 9, 1986 & JP-A-61088668 (NEC Home Electronics).

Primary Examiner—Tan V. Mai
Attorney, Agent, or Firm—Wolf, Greenfield & Sacks

[57] ABSTRACT

A bidimensional Finite Impulse Response (FIR) filter of rank $2p+1$ for processing data associates a "vertical" filter and a "horizontal" filter. Each filter comprises $2p+1$ cells and circuitry for vertically scanning the data according to stripes having a height of p data; circuitry for simultaneously providing on a first line a datum of a stripe, on a second line a datum of the former stride shifted by p data, and on a third line, a datum of the still former stripe again shifted by p data; and circuitry for, at each clock time, connecting each cell input to one of the three lines.

33 Claims, 4 Drawing Sheets

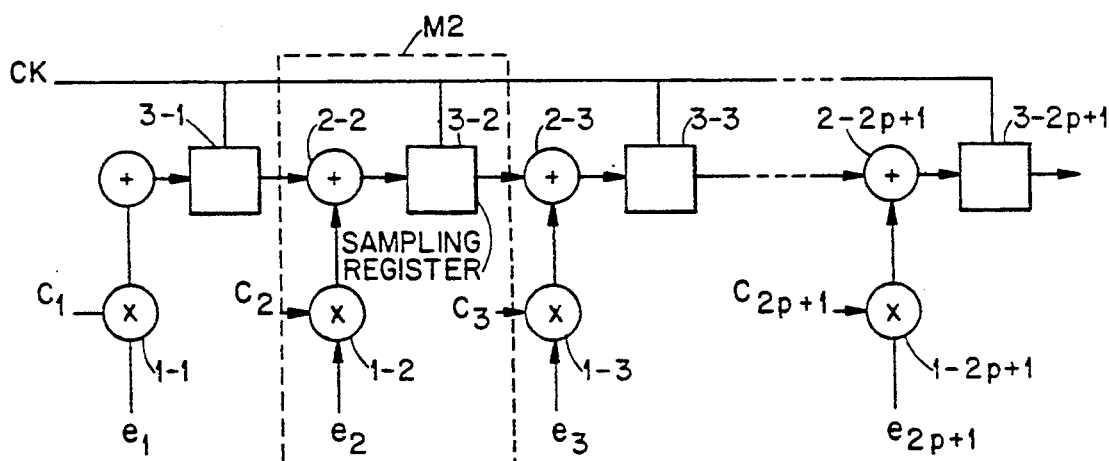
FIG. 1
FIG. 2 (PRIOR ART)
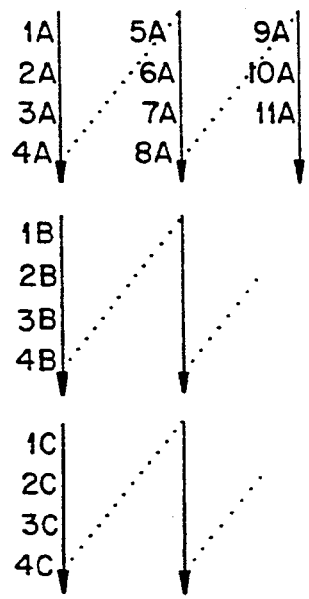
FIG. 3

BIDIMENSIONAL FIR FILTER

This application is a continuation of application Ser. No. 07/926,815 filed on Aug. 7, 1992, U.S. Pat. No. 5,265,041.

BACKGROUND OF THE INVENTION

The present invention relates to bidimensional filters of the finite impulse response (FIR) type such as used especially for encoding TV pictures, for example for achieving a so-called "subband" encoding. In this application, the invention will be described in relation to the processing of a TV picture in which a memory contains the successive pixels of a picture. However, it is clear that the invention applies generally to the filtering of data arranged according to a bidimensional matrix.

Given a picture constituted by pixels Pij, as represented in FIG. 1, where i is a line index included between 1 and M, and j is a column index included between 1 and N, bidimensional FIR filtering comprises performing operations of linear combination on sequences of one-line pixels and on sequences of one-column pixels. It is said that the filtering is of rank $2p+1$ if the considered sequence is a sequence associating $2p+1$ successive pixels.

Thus, vertical filtering is defined by the following relation (1):

$$Qij = \sum_{k=i-p}^{k=i+p} Ck \cdot Pkj \quad (1)$$

where Ck designates a coefficient, and horizontal filtering is defined by the following relation (2):

$$Rij = \sum_{k=j-p}^{k=j+p} Dk \cdot Qik \quad (2)$$

where Dk designates a coefficient.

These operations being linear, it will be noticed that the order of the horizontal and vertical filtering operations is of no consequence.

FIG. 2 is a diagram of a conventional FIR filter, used as a basis for the construction of a horizontal or vertical filter. This filter includes a series of identical modules $M_1$ to $M_{2p+1}$. In the figure, module $M_2$ only is identified by a frame drawn in dotted lines. This module comprises a data input terminal e2 of a multiplier 1-2 where the input datum is multiplied by a coefficient C2. The figure shows the datum arriving on a single line. In fact, this datum is generally a binary word of several bits and input e2 corresponds to a bus comprising as many lines as bits included in the word. The output of multiplier 1-2 is sent to the first input of an adder 2-2, the second input of which receives the output of the preceding module. The adder output is connected to the input of a sampling register 3-2 which corresponds to a clock edge. The output of sampling register 3-2 is connected to the second input of the adder of the next module. All these registers are controlled by a clock CK which enables, at the introduction rate of the data, reading the datum present at the output of the preceding adder and sending the previously stored datum to the next adder.

It will be clear that such a filter, all the inputs of which are interconnected, enables performance of the operation indicated by formula (1). Indeed, considering the case where p=2 (5 modules), and assuming that data p1 . . . pn are successively introduced, output S provides at the sixth clock time:

$$Q13 = C1\ P11 + C2\ P12 + C3\ P13 + C4\ P14 + C5\ P15,$$

at the seventh clock time:

$$Q14 = C1\ P12 + C2\ P13 + C3\ P14 + C4\ P15 + C5\ P16,$$

and so forth.

Various correction techniques are known by those skilled in the art to provide, if necessary, data Q11, Q12 which are available with the elementary circuit described above. Thus, in the conventional case where the data matrix, namely a TV pixel image is scanned by horizontal lines, the row data sequentially arrive and the filter easily lends itself to horizontal filtering.

But, for vertical filtering, pixels P11, P21, P31 . . . PM1 are to be sequentially provided to the filter before processing pixels P12, P22 . . . PM2. This implies, still in the case of conventional horizontal scanning, to provide upstream of the filter delay lines having substantially the duration of a line. For a filter of rank $2p+1$, $2p$ delay lines are to be provided. Such an architecture is for example described in the Article by Rao et al., Proceedings of IEEE International Symposium on Circuits and Systems, New Orleans, La., May 1990, pages 3050-3052. The delay lines are conventionally achieved by memories and, for example, for a filter of rank 17 and pixels defined on 8 bits, 16 memories connected to the filter through 16 buses of 8 bits are to be provided. If the filter and the delay lines are achieved in various chips, this requires, for the filter chip, the provision of an extremely high number of pads, with a resulting very expensive casing (the cost of an integrated circuit casing increasing very quickly with the number of pins of this casing) and a limited efficiency. Consequently, it has been proposed to include the memories serving as delay lines in the filter chip. But then, the chip has a very large silicon surface. In addition, the optimized technologies for manufacturing memories are generally not the same as those used for manufacturing filter cells. As a result, the chip of the assembly is not optimized. Anyhow, this integration of filters and memories on a single chip becomes impossible when the rank of the filter becomes too high, for example 65, or when the data words to be processed contain too many bits, for example 16 or 32.

This problem is all the more crucial as, in some TV circuits, for example those provided for high definition TV, in which it is desired to use a subband encoding technique, several filters are provided in a single TV set.

SUMMARY OF THE INVENTION

Thus, an object of the invention is to provide a new architecture for a FIR bidimensional filter enabling to optimize the implementation of the vertical filter without adversely affecting the implementation of the associated horizontal filter.

A further object of the invention is to provide a bidimensional FIR filter in which the memory portion and the filter portion itself are achieved in separated chips with a limited number of links between both chips.

To achieve these objects and others, the invention generally provides a digital bidimensional filter of rank $2p+1$ for processing matrix data, sequentially comprising a "vertical" filter and a "horizontal" filter. The matrix data are applied to the vertical filter by a vertical scanning circuit having horizontal bands of a height of p data of the data matrix, the horizontal filter receiving the output data of the vertical filter according to the same scanning mode.

More particularly, the invention provides a FIR bidimensional filter of rank $2p+1$ for data processing associating a "vertical" filter and a "horizontal" filter, each filter comprising $2p+1$ cells. Each cell comprises a multiplier having a data input for receiving data and a coefficient input for receiving a predetermined coefficient, the multiplier output being connected to the first input of an adder, the output of which is connected to a register, the register output being connected to the second input of the adder of the next cell. The registers are controlled at the rate of the data introduction. The vertical filter comprises means for vertically scanning the data along stripes having a height of p data; means for simultaneously providing on a first line a stripe datum, on a second line a datum of the preceding stripe shifted by p data, on a third line, a datum of the penultimate preceding stripe again shifted by p data; and means for, at each clock time, connecting each cell input to one of the three lines. According to an embodiment of the invention, the horizontal filter comprises means for simultaneously providing to the inputs of the horizontal filter the output data of the vertical filter mutually shifted by $p+1$ data. According to an embodiment of the invention, the inputs on lines 1, $p+1$ and $2p+1$ of the vertical filter are direct and the other inputs are equipped with two-channel multiplexers controlled so that the connection sequence of inputs to the line is as follows:

input 1: always connected to the first line;
input l ($1<1<p+1$): $1-1$ times to the second line, then $p-1+1$ times to the first line;
input $p+1$: always connected to the second line;
input m($p<m<2p+1$): $m-p-1$ times to the third line, then $2p+1-m$ times to the second line;
input $2p+1$: always connected to the third line;

a sequencer indicating the first datum of a column by which this sequence starts.

BRIEF DESCRIPTION OF THE DRAWINGS

The foregoing and other objects, features and advantages of the invention will be apparent from the following detailed description of preferred embodiments as illustrated in the accompanying figures wherein:

FIG. 1, above described, shows a picture memory;
FIG. 2, above described, shows a conventional cell of a FIR filter;
FIG. 3 shows a scanning mode used according to the invention.

DETAILED DESCRIPTION OF THE INVENTION

In order to facilitate and simplify the practical implementation of a FIR bidimensional filter, the invention uses a stripe-type vertical scanning rather than a conventional raster horizontal scanning.

FIG. 3 illustrates the scanning mode used and the notations that will be used in the description that follows.

Hereafter, to simplify the description, the specific case of a recursive filter of rank 9 will be considered, that is, $p=4$ and $2p+1=9$. In that case, the invention uses a vertical scanning through stripes having a height of $p=4$ pixels. FIG. 3 illustrates three successive scanning stripes, the elements of the first stripe being designated vertically by 1A, 2A, 3A, 4A; 5A, 6A, 7A, 8A; 9A, 10A, 11A, 12A; 13A . . . , the corresponding elements of the next two stripes being designated by the same number and respectively by letters B and C.

Figure 4:
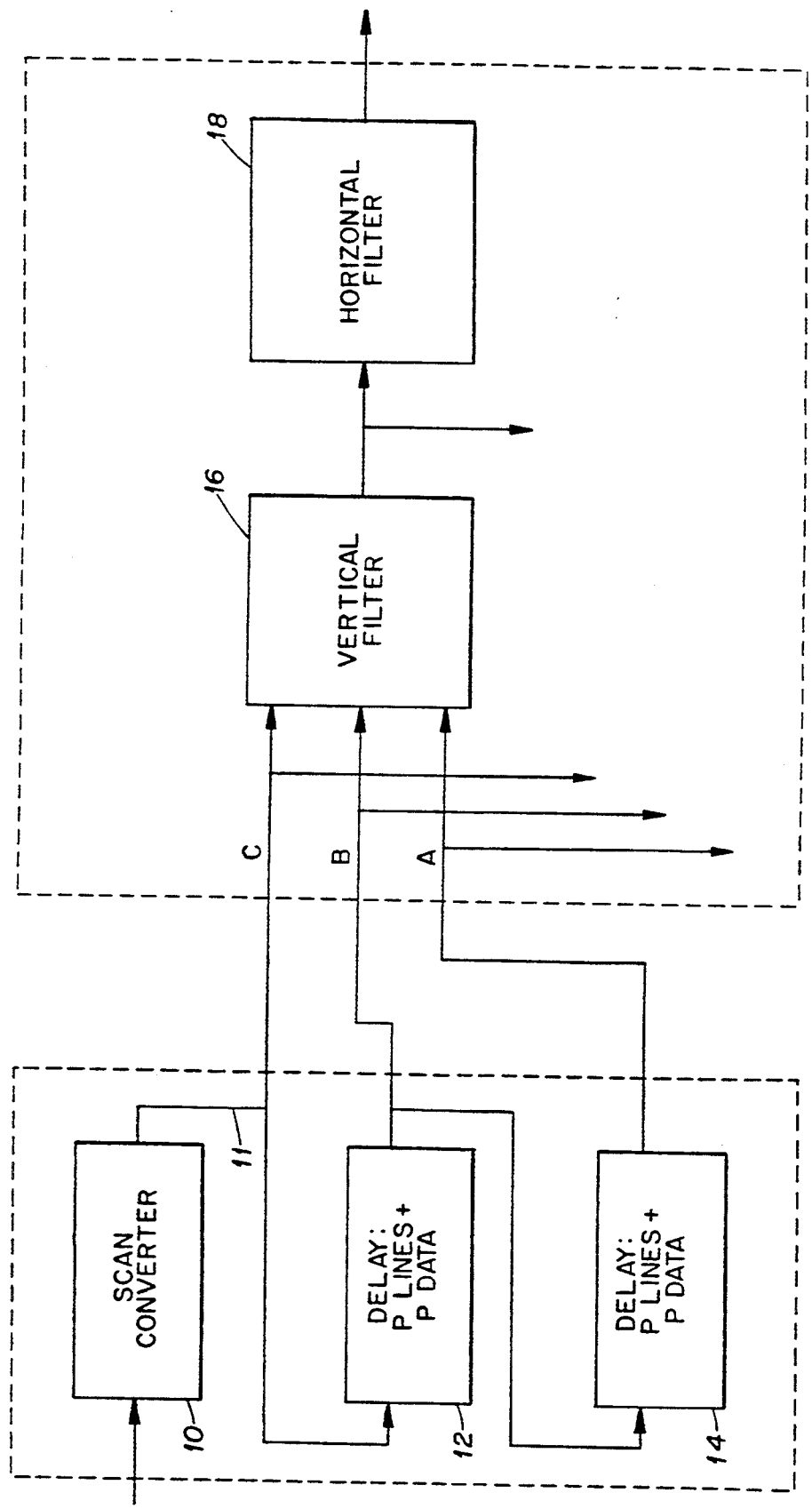
FIG. 4 shows the general architecture of a filter according to the invention.

FIG. 4 shows the general architecture of a bidirectional, vertical and horizontal filtering system, according to the invention.

This system comprises a scanning conversion circuit 10 providing a vertical stripe scanning of the type illustrated in FIG. 3 at an output 11. This circuit is followed by two delay memories of p lines+p data (here, $p=4$). C, B and A designate buses carrying the output of the scanning conversion circuit 10, of the first delay memory 12, and of the second delay memory 14, respectively. These outputs C, B and A are sent to a vertical filter 16 and, if necessary, to other analog vertical filters (not shown). The vertical filter output is sent to a horizontal filter 18 and, if necessary, to other horizontal filters (not shown).

Figure 5:
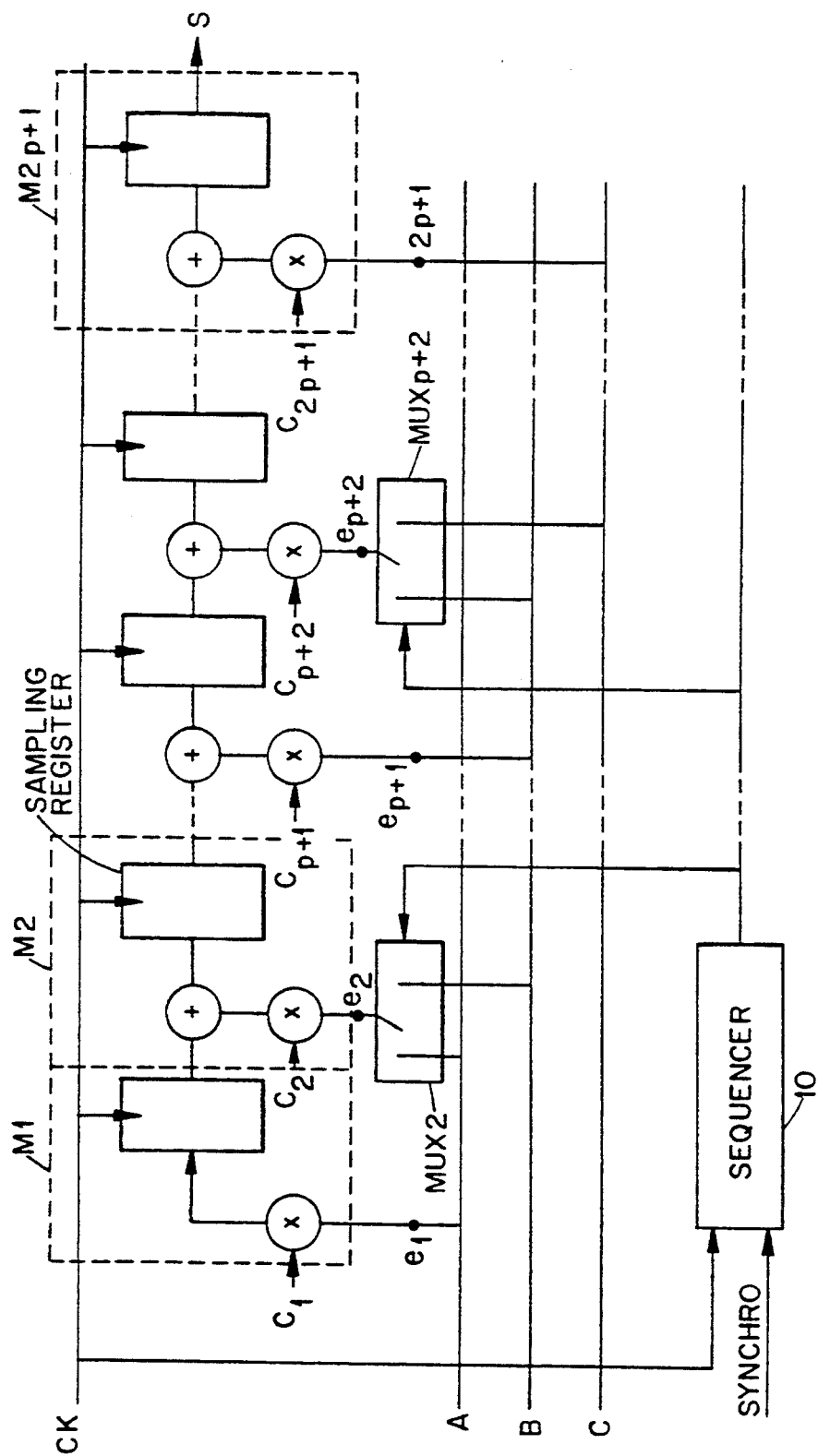
FIG. 5 shows the filter portion itself of a vertical filter according to the invention.

FIG. 5 shows an embodiment of the vertical filter and exemplifies its connections with buses A, B and C.

For reasons which will appear later on, input $e_1$ of cell $M_1$ is connected to bus A, input $e_{p+1}$ of cell $M_{p+1}$ is connected to bus B, and input $e_{2p+1}$ of cell $M_{2p+1}$ is connected to bus C. The cells included between the cell $M_1$ and cell $M_{p+1}$ have their input connected through a multiplexer MUX to either one of buses A and B, and the cells included between cell $M_{p+1}$ and cell $M_{2p+1}$ have their input connected through a multiplexer to either one buses B and C.

Referring to the notations of FIG. 3, it clearly appears that it is desired to sequentially provide to inputs e1–e9, when $p=4$, the following signals:

| | e1 | e2 | e3 | e4 | e5 | e6 | e7 | e8 | e9 | S |
|---|---|---|---|---|---|---|---|---|---|---|
| ↓ | 1A | | | | | | | | | |
| ↓ | 2A | 2A | | | | | | | | |
| ↓ | 3A | 3A | 3A | | | | | | | |
| ↓ | 4A | 4A | 4A | 4A | | | | | | |
| ↓ | 5A | 1B | 1B | 1B | 1B | | | | | |
| ↓ | 6A | 6A | 2B | 2B | 2B | 2B | | | | |
| ↓ | 7A | 7A | 7A | 3B | 3B | 3B | 3B | | | |
| ↓ | 8A | 8A | 8A | 8A | 4B | 4B | 4B | 4B | | |
| ↓ | 9A | 5B | 5B | 5B | 5B | 1C | 1C | 1C | 1C | |
| ↓ | 10A | 10A | 6B | 6B | 6B | 6B | 2C | 2C | 2C | →1S |
| ↓ | 11A | 11A | 11A | 7B | 7B | 7B | 7B | 3C | 3C | →2S |
| ↓ | 12A | 12A | 12A | 12A | 8B | 8B | 8B | 8B | 4C | →3S |
| ↓ | 13A | 9B | 9B | 9B | 9B | 5C | 5C | 5C | 5C | →4S |
| ↓ | 14A | 10B | 10B | 10B | 10B | 6C | 6C | 6C | 6C | →5S |
| time | | | | | | | | | | |

The general rule to be followed is deduced from this table. Bus B must present the data of bus A shifted by p (=4) lines plus p (=4) clock periods and, similarly, bus C must present the data of bus B delayed by p lines+p clocks periods in order to, for example, simultaneously present to the filters pixels 9A, 5B and 1C; 10A, 6B and 2C; 11A, 7B and 3C . . . This result is obtained with the delay circuits adjusted in the way illustrated in FIG. 4. On the other hand, it can be seen that the control sequences of the multiplexers respectively choose each of the inputs as follows:

```
↓  A  B  B  B  B  C  C  C  C
↓  A  A  B  B  B  B  C  C  C
↓  A  A  A  B  B  B  B  C  C
↓  A  A  A  A  B  B  B  B  C
time
```

This sequence is periodic with a period 4 (p) and starts at the same time as a pixel of the upper line is presented (1A, for example). A sequencer 20, triggered by a synchronization signal, provides this function. It can be seen from the above table that the inputs 1, 5 and 9 (1, p+1 and 2p+1) need not being associated with a multiplexer.

More generally, for a filter of rank $2p+1$, each of the three buses A, B, C scans p video lines and the control sequence of the multiplexer, periodic with a period p, is as follows:

| | |
|---|---|
| Input $e_1$: | always connected to A |
| Input $e_2$: | 1 time B, then (p − 1) times A |
| Input $e_l$ (1 < l < p + 1): | l − 1 time B, then (p − l + 1) times A |
| Input $e_{p+1}$: | always connected to B |
| Input $e_m$ (p + 1 < m < 2p + 1): | m − p − 1 times C then 2p + 1 − m times B |
| Input $e_{2p+1}$: | always connected to C |

Referring back to FIG. 4, it is noted that the circuit according to the invention connects the assemblies of storage and scanning conversion circuits to a filter circuit with only three buses instead of 2p buses, as in the prior art. This is very significant when the filter is of a high rank (p=8, 16, or 32) and that the data to be filtered comprise a high number of bits (8, 16 or 32). Thus, it is possible to manufacture filtering circuits using processor-type technologies which are particularly well adapted for this fabrication. It is also possible to manufacture the circuit comprising the memories including adapted circuits as well, for example DRAM memory circuits, which permits integrating a very high number of cells on a relatively small surface.

It will be noted that, as compared to conventional circuits, the memory part itself according to the invention comprises two p-lines memories plus a scanning conversion memory including p lines too. Whereas, conventionally, only 2p memories of one line have been used. This drawback of the invention is only apparent, on the one hand, because of the major advantage brought by the decrease in the number of buses connecting the memories to the filter and, therefore, in the number of pads for the filtering circuit and, on the other hand, due to the fact that, according to the invention, the memories can be integrated in a separate chip made according to an adapted technology. In addition, it will be noted that the scanning conversion circuit is also often used in other parts of a system processing TV pictures.

Figure 6:
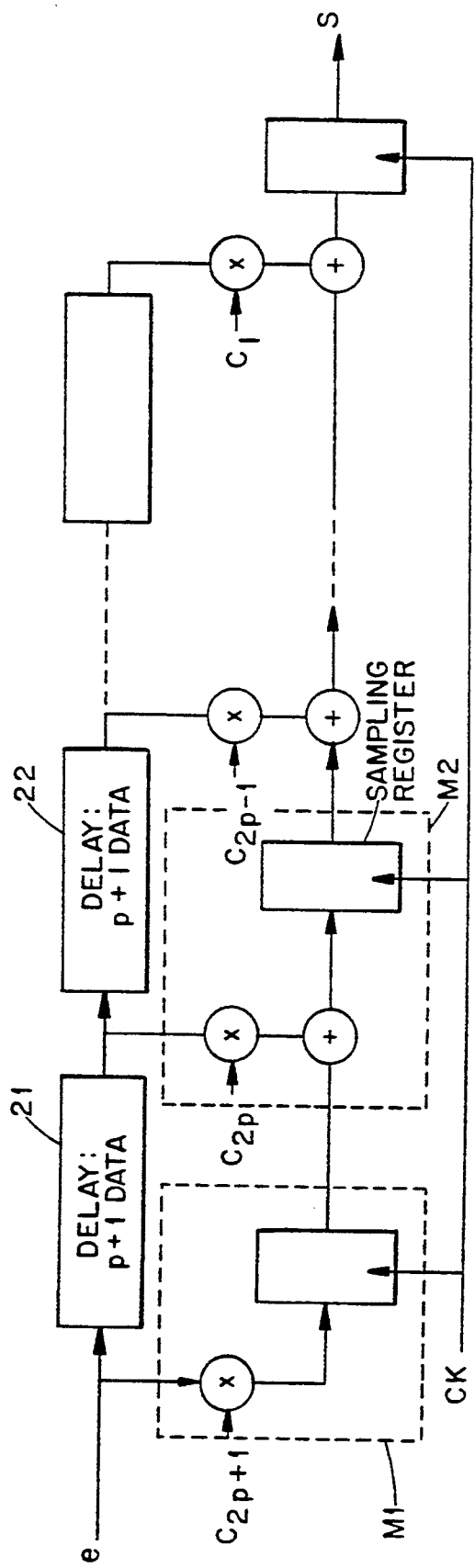
FIG. 6 shows the filter portion itself of a horizontal filter according to the invention.

On the other hand, as will be shown in connection with FIG. 6, the major simplification brought by the invention for achieving the vertical filter does not cause a significant complexity increase of the horizontal filter.

At the vertical filter output, data are scanned by stripes. Therefore, the horizontal filter must receive on its successive inputs data separated one from the other by p+1 clock pulses. This is easily achieved with the circuit illustrated in FIG. 6, where the same reference characters designate the same elements as in the preceding figures. It will be noted that, between each input, a delay memory 21, 22 ... of p+1 data is provided, that is, a small-size memory as compared to one-line duration memories (it is to be remembered that usually, for conventional TV sets, a line comprises about 700 pixels and in high definition TV, about 2,000 pixels).

In subband encoding applications, a selected number of data of a sequence will conventionally be eliminated at the output of each filter and an appropriate scanning rate will be chosen.

I claim:

1. A bidimensional filter for filtering an input stream of electrical signals that represents a bidimensional matrix having a plurality of rows and a plurality of columns, the input stream of electrical signals being supplied in a row-ordered sequence, the bidimensional filter comprising:
   conversion means for converting the sequence of the input stream of electrical signals and generating a converted stream of electrical signals that represents the bidimensional matrix in a column-ordered sequence;
   first filtering means, coupled to the conversion means, for filtering the converted stream of electrical signals and generating a first filtered stream of electrical signals that is substantially vertically filtered; and
   second filtering means, coupled to the first filtering means, for further filtering the first filtered stream of electrical signals and generating a bidimensionally filtered stream of electrical signals representing the bidimensional matrix.

2. The filter of claim 1, wherein the bidimensional filter has a rank, and the conversion means further comprises scanning means for generating the converted stream of electrical signals to have a column-ordered sequence that represents a plurality of stripes, such stripe having a height determined by the rank of the bidimensional filter.

3. The bidimensional filter of claim 2, wherein the conversion means further comprises a first delay means, coupled between the scanning means and the first filtering means, for delaying the converted stream of electrical signals for a first predetermined time period to generate a once-delayed stream of electrical signals, and for transmitting the once-delayed stream of electrical signals to the first filtering means.

4. The bidimensional filter of claim 3, wherein the conversion means further comprises a second delay means, coupled between the first delay means and the first filtering means, for delaying the once-delayed stream of electrical signals for a second predetermined time period to generate a twice-delayed stream of electrical signals, and for transmitting the twice-delayed stream of electrical signals to the first filtering means.

5. The bidimensional filter of claim 4, wherein the rank of the filter is $2p+1$ and the first filtering means further comprises:
   $2p+1$ sequentially-connected cells, each cell accepting an input, the $2p+1$ sequentially-connected cells having a first cell, a middle cell and a last cell;
   the first cell receiving an input from the converted stream of electrical signals;
   the middle cell receiving an input from the once-delayed stream of electrical signals; and
   the last cell receiving an input from the twice-delayed stream of electrical signals.

6. The bidimensional filter of claim 5, further comprising:
   first multiplexer means, coupled to at least one of the $2p+1$ cells, for alternately selecting and transmitting to the at least one cell a signal from one of the once-delayed and twice-delayed streams of electrical signals; and
   sequencer means for controlling the first multiplexer means to alternately select between the once-delayed and twice-delayed streams of electrical signals in a predetermined sequence.

7. The bidimensional filter of claim 6, further comprising:
   second multiplexer means, coupled to at least one of the $2p+1$ cells, for alternately selecting and transmitting to the at least one cell a signal from one of the converted and once-delayed streams of electrical signals; and wherein
   said sequencer means further includes means for controlling the second multiplexer means to alternately select between the converted and once-delayed streams of electrical signals in a predetermined sequence.

8. The bidimensional filter of claim 5, further comprising:
   multiplexer means, coupled to at least one of the $2p+1$ cells, for alternately selecting and transmitting to the at least one cell a signal from one of the converted and once-delayed streams of electrical signals; and
   sequencer means for controlling the multiplexer means to alternately select between the converted and once-delayed streams of electrical signals in a predetermined sequence.

9. The bidimensional filter of claim 8, wherein:
   the first cell is always coupled to the scan converter means to receive the converted stream of electrical signals;
   the middle cell is always coupled to the first delay means to receive the once-delayed stream of electrical signals; and
   the last cell is always connected to the second delay means to receive the once-delayed stream of electrical signals; and
   wherein the sequencer means controls the multiplexer means to couple the conversion means, and the first and second delay means to the $2p+1$ cells so that;
   an L cell means, wherein $1 < L < p+1$, is coupled to the first delay means for $L-1$ clock periods and to the scan converter means for $p-L+1$ clock periods; and
   an m cell means, wherein $p+1 < m < 2p+1$, is coupled to the second delay means for $m-p-1$ clock periods and to the first delay means for $2p+1-m$ clock periods.

10. The bidimensional filter of claim 9, wherein the second filtering means further comprises $2p+1$ sequentially-connected cell means, each for filtering received signals.

11. The bidimensional filter of claim 10, wherein the second filtering means includes transposing means for converting the converted stream of column-ordered data into row-ordered data, the transposing means comprising a third delay means, coupled to each cell means in the second filtering means, for delaying an electrical signal received at an input of the third delay means by $p+1$ electrical signals.

12. The filter of claim 11, wherein each of the cells in the first and second filtering means further comprises:
   a multiplier means for multiplying a coefficient signal and an input signal to provide a first output signal;
   an adder means, having a first input coupled to the multiplier means and a second input coupled to a previous cell means, for adding the output signal of the multiplier means to a signal supplied by the previous cell means to provide a second output signal; and
   a sampling register means, coupled to the adder means, for storing the second output signal in response to a clock signal.

13. A bidimensional filter for filtering an input stream of electrical signals that represents a bidimensional matrix having a plurality of rows and a plurality of columns, the input stream of electrical signals being supplied in a row-ordered sequence, the bidimensional filter comprising:
   a scan converter that converts the sequence of the input stream of electrical signals and generates a converted stream of electrical signals that represents the bidimensional matrix in a column-ordered sequence;
   a first filter, coupled to the scan converter, that filters the converted stream of electrical signals and generates a first filtered stream of electrical signals that is substantially vertically filtered; and
   a second filter, coupled to the first filter, that further filters the first filtered stream of electrical signals and generates a bidimensionally filtered stream of electrical signals representing the bidimensional matrix.

14. The filter of claim 13, wherein the bidimensional filter has a rank, and the scan converter generates the converted stream of electrical signals to have a column-ordered sequence that represents a plurality of stripes, each stripe having a height determined by the rank of the bidimensional filter.

15. The bidimensional filter of claim 14, further comprising a first delay circuit that delays the converted stream of electrical signals for a first predetermined time period to generate a once-delayed stream of electrical signals to the first filter.

16. The bidimensional filter of claim 15, further comprising a second delay circuit that delays the once-delayed stream of electrical signals for a second predetermined time period to generate a twice-delayed stream of electrical signals, and for transmitting the twice-delayed stream of electrical signals to the first filter.

17. The bidimensional filter of claim 16, wherein the rank of the filter is $2p+1$ and the first filter further comprises:
   $2p+1$ sequentially-connected cells, each cell accepting an input, the $2p+1$ sequentially-connected cells having a first cell, a middle cell and a last cell;
   the first cell receiving an input from the converted stream of electrical signals;
   the middle cell receiving an input from the once-delayed stream of electrical signals; and
   the last cell receiving an input from the twice-delayed stream of electrical signals.

18. The bidimensional filter of claim 17, further comprising:
   a first multiplexer, coupled to at least one of the $2p+1$ cells, for alternately selecting and transmitting to the at least one cell a signal from one of the once-delayed and twice-delayed streams of electrical signals; and a sequencer for controlling the first multiplexer to alternately select between the once-delayed and twice-delayed streams of electrical signals in a predetermined sequence.

19. The bidimensional filter of claim 18, further comprising:

a second multiplexer, coupled to at least one of the $2p+1$ cells, for alternately selecting and transmitting to the at least one cell a signal from one of the converted and once-delayed streams of electrical signals; and wherein said sequencer controls the second multiplexer to alternately select between the converted and once-delayed streams of electrical signals in a predetermined sequence.

20. The bidimensional filter of claim 17, further comprising:

a multiplexer, coupled to at least one of the $2p+1$ cells, for alternately selecting and transmitting to the at least one cell a signal from one of the converted and once-delayed streams of electrical signals; and a sequencer that controls the multiplexer to alternately select between the converted and once-delayed streams of electrical signals in a predetermined sequence.

21. The bidimensional filter of claim 20, wherein:

the first cell is coupled to the scan converter to receive the converted stream of electrical signals;

the middle cell is coupled to the first delay circuit to receive the once-delayed stream of electrical signals; and the last cell is coupled to the second delay circuit to receive the once-delayed stream of electrical signals; and wherein the sequencer controls the multiplexer to couple the converted stream, the once-delayed stream, and the twice-delayed stream of electrical signals to the $2p+1$ cells so that;

an L cell, wherein $1<L<p+1$, is coupled to the once-delayed stream of electrical signals for $L-1$ clock periods and to the converted stream of electrical signals for $p-L+1$ clock periods; and an m cell, wherein $p+1<m<2p+1$, is coupled to the twice-delayed stream of electrical signals for $m-p-1$ clock periods and to the once-delayed stream of electrical signals for $pp+1-m$ clock periods.

22. The bidimensional filter of claim 21, wherein the second filter further comprises $2p+1$ sequentially-connected cells, each providing a filtering effect on the received signals.

23. The bidimensional filter of claim 22, wherein the second filter further comprises a third delay circuit, coupled to at least one cell in the second filter, for delaying an electrical signal received at an input of the at least one cell by $p+1$ electrical signals.

24. The filter of claim 23, wherein each of the cells in the first and second filter further comprises:

a multiplier circuit that multiplies a coefficient signal and an input signal to provide a first output signal;

an adder circuit, having a first input coupled to the multiplier and a second input coupled to a previous cell, for adding the output signal of the multiplier to a signal supplied by the previous cell to provide a second output signal; and a sampling register, coupled to the adder circuit, for storing the second output signal in response to a clock signal and generating a cell output.

25. A method for bidimensionally filtering an input serial stream of electrical signals that represents a bidimensional matrix having a plurality of rows and columns, the input serial stream arriving in a row-ordered sequence, the method comprising the steps of:

A. converting the input serial stream of electrical signals to generate a converted serial stream of electrical signals having a column-ordered sequence;

B. filtering the converted stream of electrical signals to generate a substantially vertically filtered stream of electrical signals; and C. filtering the substantially vertically filtered stream of electrical signals to generate a bidimensionally filtered stream of electrical signals.

26. The method as set forth in claim 25, wherein step A includes a step or organizing the converted stream of electrical signals by column-oriented stripes, wherein each stripe represents a group of p rows of the bidimensional matrix.

27. The method as set forth in claim 26, wherein:

step A includes a step of delaying the converted stream of electrical signals by an amount of time corresponding to a transmission time of one stripe, to generate a once-delayed stream of electrical signals; and step B includes combining the converted and once-delayed streams of electrical signals.

28. The method as set forth in claim 27, wherein:

step A includes a step of delaying the once-delayed second stream of electrical signals by an amount of time corresponding to the transmission time of one stripe, to generate a twice-delayed second stream of electrical signals; and step B includes combining the converted, once-delayed and twice-delayed streams of electrical signals.

29. The method as set forth in claim 28, wherein step B includes performing $2p+1$ sequential filtering steps.

30. The method as set forth in claim 29, wherein the step of combining the converted, once-delayed and twice-delayed streams of electrical signals includes a step of selecting, for each of the $2p+1$ sequential filtering steps, one of the converted, once-delayed and twice-delayed streams of electrical signals.

31. The method as set forth in claim 30, wherein the step of selecting includes a step of alternating between one and another of the second stream, the once-delayed stream, and the twice-delayed stream of electrical signals.

32. The method as set forth in claim 31, wherein step C includes performing $2p+1$ sequential filtering steps.

33. The method as set forth in claim 32, wherein step C includes a step of delaying by a predetermined time period between each sequential filtering step, the predetermined time period being related to $p+1$.

* * * * *